(12) United States Patent
Lian

(10) Patent No.: US 12,119,818 B2
(45) Date of Patent: Oct. 15, 2024

(54) PHOTOELECTRIC SWITCH KEY AND KEYBOARD

(71) Applicant: 5-LINK TECHNOLOGY CO., LTD., Dongguan (CN)

(72) Inventor: Jiunnwoei Lian, Dongguan (CN)

(73) Assignee: 5-LINK TECHNOLOGY CO., LTD., Guangdong (CN)

( * ) Notice: Subject to any disclaimer, the term of this patent is extended or adjusted under 35 U.S.C. 154(b) by 62 days.

(21) Appl. No.: 17/928,776

(22) PCT Filed: May 13, 2020

(86) PCT No.: PCT/CN2020/090067
§ 371 (c)(1),
(2) Date: Nov. 30, 2022

(87) PCT Pub. No.: WO2021/203519
PCT Pub. Date: Oct. 14, 2021

(65) Prior Publication Data
US 2023/0231555 A1 Jul. 20, 2023

(30) Foreign Application Priority Data
Apr. 7, 2020 (CN) .......................... 202010264761.3

(51) Int. Cl.
*H03K 17/969* (2006.01)
*H01H 13/7065* (2006.01)
*H03K 17/96* (2006.01)

(52) U.S. Cl.
CPC ....... *H03K 17/969* (2013.01); *H01H 13/7065* (2013.01); *H03K 17/9631* (2013.01); *H01H 2239/022* (2013.01)

(58) Field of Classification Search
CPC ............... H03K 17/96; H03K 17/9627; H03K 17/9631; H03K 17/965; H03K 17/967;
(Continued)

(56) References Cited

U.S. PATENT DOCUMENTS 3,761,919 A   9/1973  Baumann
4,049,964 A * 9/1977  Wuchinich ........... H03K 17/968
                                                        250/221
(Continued)

FOREIGN PATENT DOCUMENTS

CN        2750570 Y    1/2006
CN      101438226 B    6/2010
(Continued)

OTHER PUBLICATIONS

International Search Report and Written Opinion mailed Dec. 30, 2020 for PCT/CN2020/090067, filed May 13, 2020.
(Continued)

*Primary Examiner* — Franklin D Balseca
(74) *Attorney, Agent, or Firm* — Peter J. Ims; Westman, Champlin & Koehler, P.A.

(57) ABSTRACT

A photoelectric switch key is provided, which includes a shell, a circuit board, a photosensitive component and a press component. The photosensitive component is electrically connected to the circuit board, and the press component is provided with a light-shielding member. The press component is movably mounted on the shell to enable the light-shielding member to move relative to a light-receiving surface of the photosensitive component. The photosensitive component is capable of receiving external light when the light-shielding member is moved away from the light-receiving surface of the photosensitive component. The light-shielding member is adjacent to and shielding the light-receiving surface of the photosensitive component when the press component is pressed. The light-shielding member is enabled to completely block the external light from irradiating on the photosensitive component when the key is pressed by the user, which achieves the function of the key, and improves the sensitivity of the key.

16 Claims, 6 Drawing Sheets

(58) Field of Classification Search
CPC .... H03K 17/968; H03K 17/969; H01H 13/70; H01H 13/7065; H01H 2239/022; H03M 11/00; H03M 11/02; H03M 11/26; G06F 3/03; G06F 3/0304
See application file for complete search history.

(56) References Cited

U.S. PATENT DOCUMENTS

| | | | |
|---|---|---|---|
| 9,634,661 B1 * | 4/2017 | Chen | ................... H03K 17/969 |
| 10,236,880 B2 | 3/2019 | Chen | |

FOREIGN PATENT DOCUMENTS

| | | |
|---|---|---|
| CN | 105074627 A | 11/2015 |
| CN | 204859148 U | 12/2015 |
| CN | 105245217 A | 1/2016 |
| CN | 207397998 U | 5/2018 |

OTHER PUBLICATIONS

Extended European Search Report from corresponding PCT/CN2020090067, dated Apr. 26, 2024.

* cited by examiner

PHOTOELECTRIC SWITCH KEY AND KEYBOARD

CROSS-REFERENCE TO RELATED APPLICATION

This application is the national phase entry of International Application No. PCT/CN2020/090067, filed on May 13, 2020, which is based upon and claims priority to the Chinese Patent Application No. 202010264761.3 filed on Apr. 7, 2020, the entire contents of which are incorporated herein by reference.

FIELD

The present application relates to the field of keyboard technology, and in particular, to a photoelectric switch key and a keyboard.

BACKGROUND

Keys of keyboards are generally divided into mechanical contact type and photoelectric switch type. For the photoelectric switch type of keyboard, an optical path is formed by an emitting element and a receiving element based on optical principles and photoelectric coupling technologies, and the optical path is connected or cutoff by a light-blocking element to change a circuit impedance to achieve an on-and-off of the circuit. In the existing photoelectric switch keys, during use, the key is generally unpressed, the optical path is disconnected, at which time the key is in a normal state. In case that the key is pressed by an operator, a light signal from the emitting element is received by a photosensitive element (or the receiving element) to form a pathway to change the circuit impedance to achieve the on and off of the circuit, thereby achieving the function of the key. Whereas the photosensitive element, in this approach, may not receive the light signal normally when the key is pressed, resulting in an unresponsive key-pressing. Moreover, it is necessary to arrange an additional emitting element in the key to send out the light signal, which results in a complicated structure and higher cost.

SUMMARY

One objective of this application is to provide a photoelectric switch key and a keyboard, to solve a problem that an unresponsive key-pressing of the photoelectric switch key in the existing technologies is prone to occur and the photoelectric switch key in the existing technologies has a complex structure.

To solve the above problem, solutions adopted in embodiments of the present application are as follows:

In a first aspect of the present application, a photoelectric switch key is provided, which includes a shell, a circuit board, a photosensitive component and a press component. The photosensitive component is electrically connected to the circuit board. The press component is provided with a light-shielding member. The press component is movably mounted on the shell to enable the light-shielding member to move relative to a light-receiving surface of the photosensitive component. The photosensitive component is capable of receiving external light when the light-shielding member is away from the light-receiving surface of the photosensitive component. The light-shielding member is adjacent to and shielding the light-receiving surface of the photosensitive component when the press component is pressed.

In one embodiment, the light-shielding member is provided with a second light-shielding cavity in communication with external environment at one end of the light-shielding member towards the photosensitive component, the second light-shielding cavity is configured to cover the photosensitive component and to shield the light-receiving surface of the photosensitive component.

In one embodiment, the shell is arranged covering the photosensitive component, the shell is provided with a light-transmitting area towards the photosensitive component for light entering, the shell is provided with a first light-shielding cavity, the first light-shielding cavity is provided with a light-transmitting opening at one end of the first light-shielding cavity towards the light-transmitting area, the photosensitive component is located within the first light-shielding cavity. The second light-shielding cavity is configured block light from irradiating onto the photosensitive component through the light-transmitting opening.

In an embodiment, the press component includes a press member and a resilient member. The shell is provided with a press cavity, the press member is mounted in the press cavity, the resilient member abuts against a cavity wall of the press cavity and the press member. The light-shielding member is provided on the press member.

In an embodiment, the shell includes a light-shielding shell and a light-transmitting shell mounted on the light-shielding shell. The first light-shielding cavity is arranged on the light-shielding shell, the light-transmitting shell is transparent to form the light-transmitting area.

In one embodiment, the photoelectric switch key further includes an LED light. The LED light is mounted on and in electrical connection with the circuit board, and the LED light is configured to emit light towards the light-transmitting shell.

In one embodiment, the light-shielding shell is provided with a light-guiding cavity, the light-guiding cavity is provided with a light-guiding opening at one end of the light-guiding cavity toward the light-transmitting shell. The LED light is located within the light-guiding cavity and configured to emit light towards the light-transmitting shell through the light-guiding opening.

In one embodiment, the photosensitive component includes a photosensitive element, the photosensitive element is mounted on and in electrical connection with the circuit board, and the photosensitive element is located within the first light-shielding cavity.

In one embodiment, the photosensitive component also includes a light-guiding member, the light-guiding member is provided on the photosensitive element and configured to guide light to irradiate onto the photosensitive element through the light transmitting opening.

In a second aspect of the present application, a keyboard is provided, including the photoelectric switch keys as above-mentioned.

Beneficial effects of the photoelectric switch key provided by embodiments of the present application may be that: The photosensitive component is electrically connected to the circuit board to form an electrical channel, when external light is received by the photosensitive component, the electrical channel is in an off state, and when the external light cannot be received by the photosensitive component, the electrical channel is switched on, and then the function of the key is realized. In this way, when the key is pressed by a user, the light-shielding member can completely block the external light from irradiating on the photosensitive component to realize the function of the key, which effectively improves the sensitivity of the key and gives the user a good experience. Moreover, the photoelectric switch key of the embodiments of the present application does not require additional pairs of infrared emission tube to supply a light source as the external light can be directly received, thereby enabling the structure of the key to be simpler and more compact, and facilitating the development of key miniaturization and lower production cost.

Beneficial effects of the keyboard provided by an embodiment of the present application may be that: the use of the above-mentioned photoelectric switch keys provide the user an easy and responsive key-pressing operation, giving the user a good experience, the structure is simple and the production cost is low.

BRIEF DESCRIPTION OF DRAWINGS

In order to illustrate schemes in the embodiments of the present application more clearly, the following will briefly introduce the drawings that need to be used in description of the embodiments or the exemplary technologies. It will be apparent that the drawings in the following description are merely some embodiments of the present application. For those of ordinary skill in this field, other drawings may also be obtained according to these drawings without any creative efforts.

Figure 1:
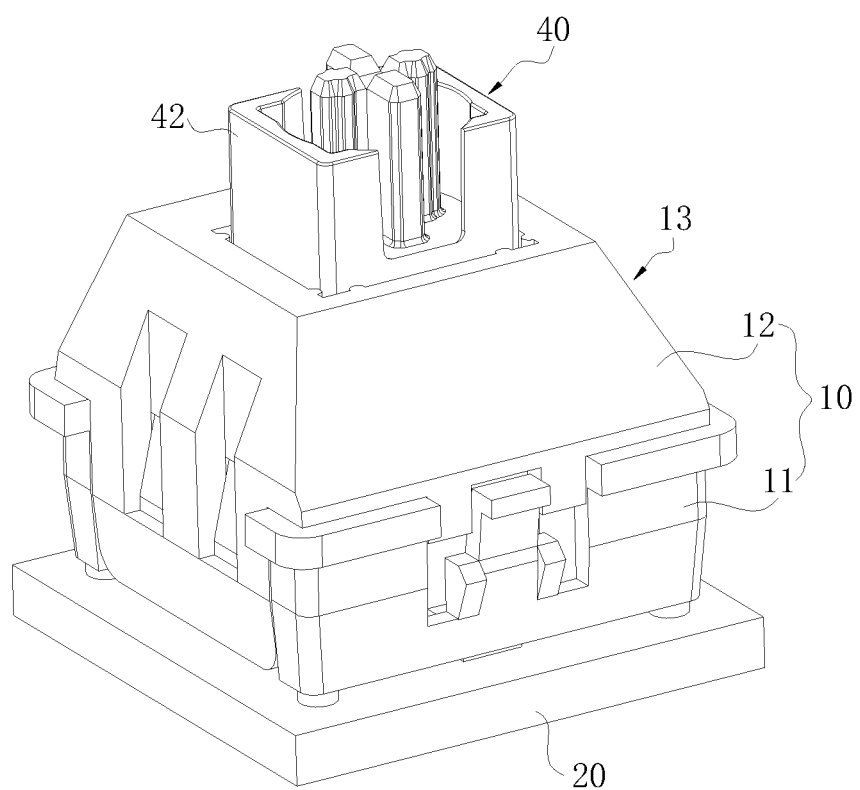
FIG. 1 is a schematic diagram of a structure of a photoelectric switch key in accordance with an embodiment of the present application.

Reference numerals in the figures are listed as follows:
10—shell;
11—light-shielding shell; 12—light-transmitting shell; 13—light-transmitting area; 14—first light-shielding cavity; 15—light-guiding cavity; 16—press cavity; 17—guide member; 18—annular sleeve; 141—light-transmitting opening; 151—light-guiding opening; 171—guide cavity;
20—circuit board;
30—photosensitive component;
31—photosensitive element; 32—light-guiding member;
40—press component;
41—light-shielding member; 42—press member; 43—resilient member; 411—second light-shielding cavity; and
50—LED light.

DETAILED DESCRIPTION OF EMBODIMENTS

In order to make the objectives, schemes and beneficial effects of the present application more comprehensible, the present application will be described in further detail below with reference to the drawings and embodiments. It should be understood that specific embodiments described herein are intended to interpret the present application only and are not intended to limit the present application.

It should be noted that when a component is referred to as "fixed to" or "arranged on" another component, it may be directly or indirectly on the other component. When a component is referred to as "connected/attached/coupled" to another component, it may be directly or indirectly connected/attached/coupled to the other component. The terms "up", "down", "left", "right", etc., indicate an orientation or positional relationship based on the orientation or positional relationship shown in the drawings, which are used for descriptive purposes only, and do not indicate or imply that the device or component referred to must have a particular orientation, be constructed and operated in a particular orientation, and therefore cannot be construed as limitations to the present application, and the specific meaning of the above terms can be understood by those of ordinary skill in the art on a case-by-case basis. The terms "first" and "second" are used for descriptive purposes only, and should not be construed as indicating or implying relative importance or implicitly specifying the number of features. The phrase "a/the plurality of" means two or more, unless otherwise expressly and specifically limited.

To illustrate the solutions provided in the present application, the following are detailed in combination with specific drawings and embodiments.

Some embodiments of the present application are directed to a photoelectric switch key. The photoelectric switch key includes a shell 10, a circuit board 20, a photosensitive component 30 and a press component 40. The photosensitive component 30 is electrically connected to the circuit board 20. The press component 40 is provided with a light-shielding member 41, and the press component 40 is movably mounted on the shell 10 to enable the light-shielding member 41 to move relative to a light-receiving surface of the photosensitive component 30. When the light-shielding member 41 is away from the light-receiving surface of the photosensitive component 30, the photosensitive component 30 can receive external light; when the press component 40 is pressed, the light-shielding member 41 is adjacent to and shielding the light-receiving surface of the photosensitive component 30.

In the photoelectric switch key provided by an embodiment of the present application, the photosensitive component 30 is electrically connected to the circuit board 20 to form an electrical channel, when the external light is received by the photosensitive component 30, the electrical channel is in an off state; and when the photosensitive component 30 cannot receive the external light, the electrical channel is switched on, and then the function of the key is realized. In this way, when the key is pressed by a user, the light-shielding member 41 completely blocks the external light from irradiating on the photosensitive component 30 to realize the function of the key, which effectively improves the sensitivity of the key and gives the user a good experience. Moreover, the photoelectric switch key of the embodiments of the present application does not require additional pairs of infrared emission tube to supply a light source as the external light can be directly received, thereby enabling the structure of the key to be simpler and more compact, and facilitating the development of key miniaturization and lower production cost.

Figure 2:
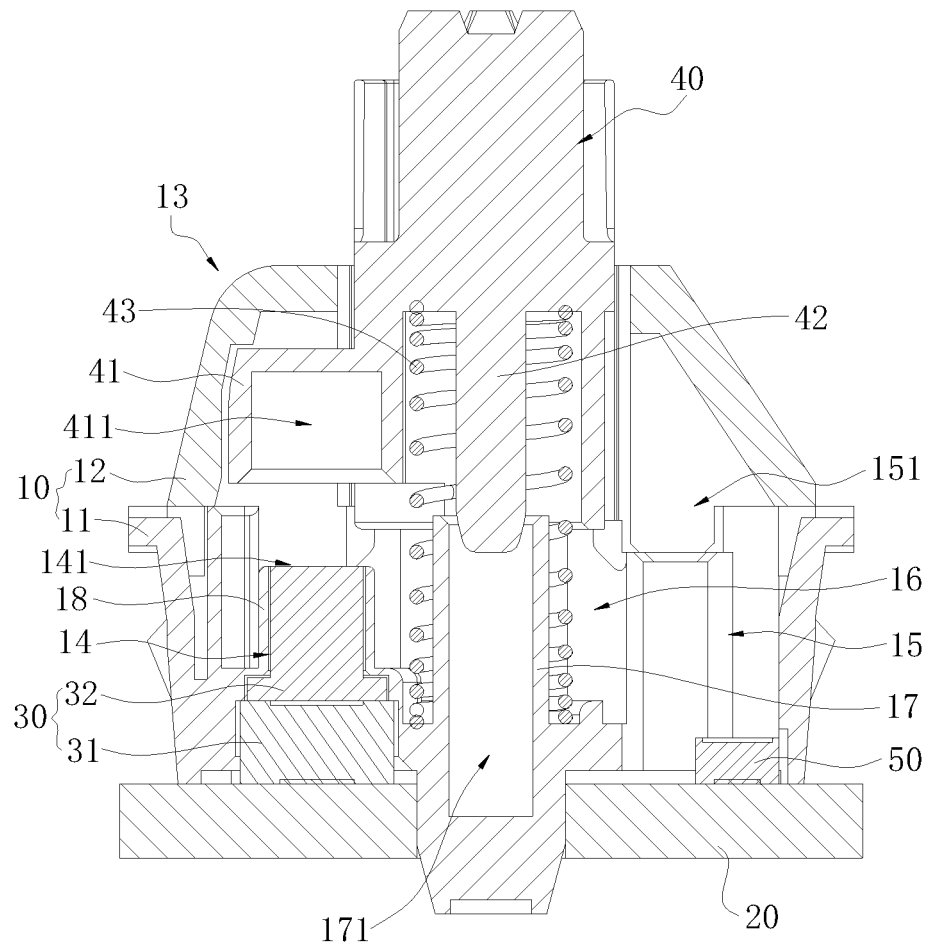
FIG. 2 is a schematic diagram of a cross-sectional structure of the photoelectric switch key in FIG. 1 in a normal state.
Figure 3:
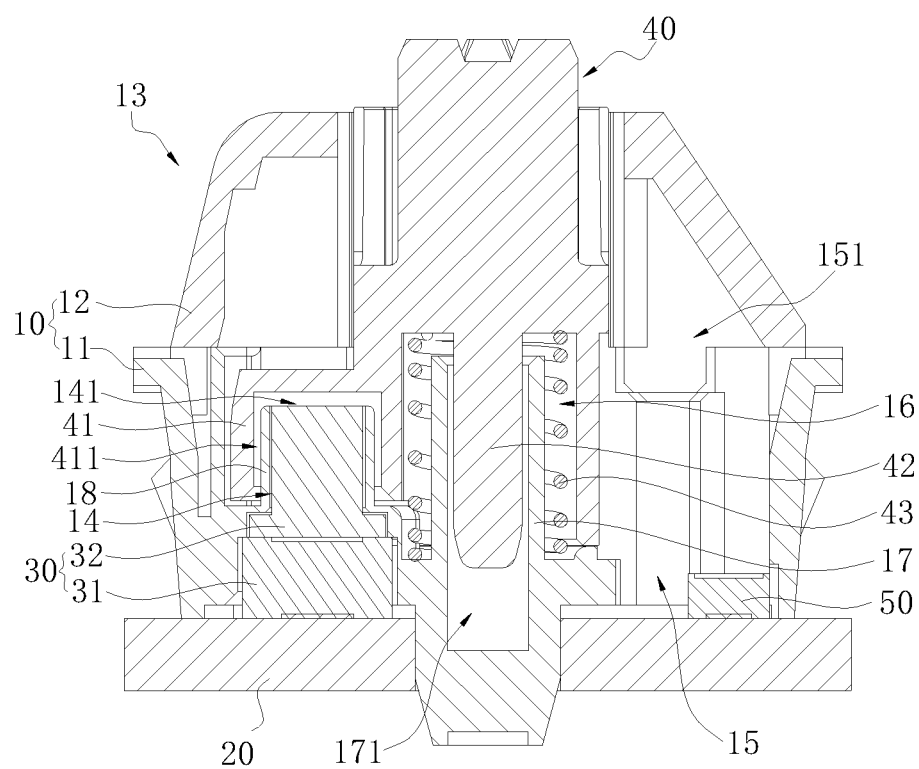
FIG. 3 is a schematic diagram of a cross-sectional structure of the photoelectric switch key in FIG. 1 in a pressed state.
Figure 6:
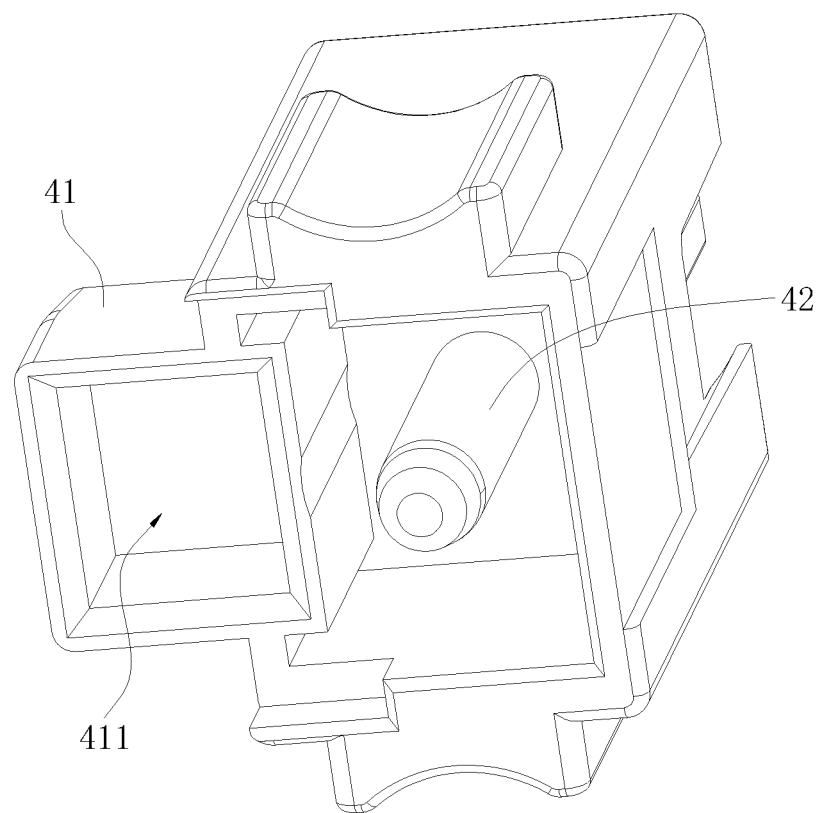
FIG. 6 is a schematic diagram of a structure of a press member of the photoelectric switch key in FIG. 4.

In another embodiment of the present application, as shown in FIGS. 2, 3, and 6, the light-shielding member 41 is provided with a second light-shielding cavity 411 in communication with external environment at one end of the light-shielding member towards the photosensitive component 30, and the second light-shielding cavity 411 is configured to cover the photosensitive component 30 and shade the light-receiving surface of the photosensitive component 30. Optionally, the light-shielding member 41 is moved synchronously with the key, the second light-shielding cavity 411 is provided on the light-shielding member 41, and a cavity wall of the second light-shielding cavity 411 is black that can completely shield the light, so that when the key is pressed by the user, the second light-shielding cavity 411 is arranged completely covering out sides of the photosensitive element 30 to block the external light from irradiating on the light-receiving surface of the photosensitive element 30, thereby the electrical channel is switched on.

Figure 5:
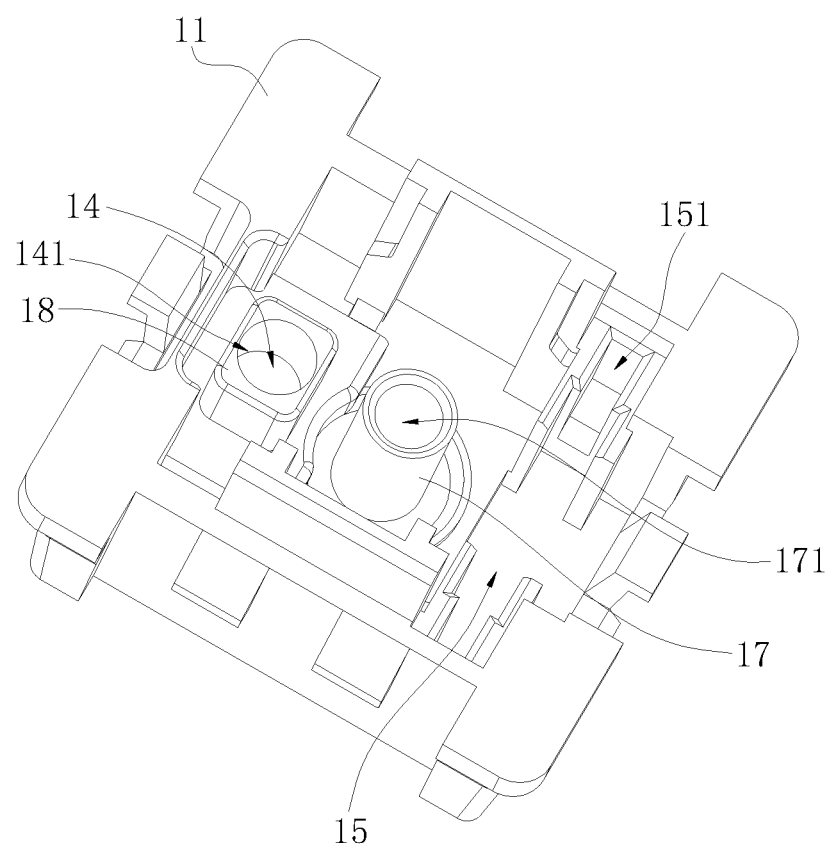
FIG. 5 is a schematic diagram of a structure of a light-shielding shell of the photoelectric switch key in FIG. 4.

In another embodiment of the present application, as shown in FIGS. 2, 3, and 5, the shell 10 is covered on the photosensitive component 30, the shell 10 is provided with a light-transmitting area 13 toward the light-transmitting component 30, and the shell 10 is provided with a first light-shielding cavity 14. The first light-shielding cavity 14 is provided with a light-transmitting opening 141 at one end toward the light-transmitting area 13. The photosensitive component 30 is located inside the first light-shielding cavity 14. The light-shielding member 41 is configured to block light from irradiating onto the photosensitive component 30 through the light-transmitting opening 141. Optionally, the light-transmitting area 13 of the shell 10 can receive external light, and the cavity wall of the first light-shielding cavity 14 is arranged to be black for shielding light, so that the light-transmitting opening 141 is the only way for light to reach the first light-shielding cavity 14, which thus can effectively improve the shading efficiency of the light-shielding member 41, and when the key is pressed, the light-transmitting opening 141 is shielded by the light-shielding member 41, thereby the sensitivity of the key is effectively improved.

In another embodiment of the present application, as shown in FIGS. 2, 3 and 5, the press component 40 includes a press member 42 and a resilient member 43. The shell 10 is provided with a press cavity 16, the press member 42 is installed in the press cavity 16. The resilient member 43 abuts against a cavity wall of the press cavity 16 and the press member 42. The light-shielding member 41 is arranged on the press member 42. Optionally, the press cavity 16 is located at a side of the first light-shielding cavity 14 and is extended in the same direction as the first light-shielding cavity 14. The press cavity 16 may guide the press member 42 to move in a direction perpendicular to the light-transmitting opening 141, to guide the light-shielding member 41 to move close to or away from the light-transmitting opening 141. In an initial state, the press member 42, under the elasticity of the elastic member 43, brings the light-shielding member 41 to be located above the light-transmitting opening 141, at which time the light can be directed to the photosensitive component 30 through the light-transmitting opening 141. Then, when the press member 42 is pressed, the spring is pressed, at which time the press member 42 is moved downward along the press cavity 16 and the light-shielding member 41 is moved toward the light-transmitting opening 141 until the light-transmitting opening 141 is completely covered by the light-shielding member 41, which enables the electrical channel to be switched on, and thus the function of the key is achieved. When the press member 42 is released by the user, the light-shielding member 41 is driven by the elastic member 43 to move upward, thereby enabling the light to enter into the first light-shielding cavity 14, and the electrical channel is switched off. The elastic member 43 may be a spring, a torsion spring or an elastic sheet, etc., which is selected as desired.

In another embodiment of the present application, as shown in FIGS. 2, 3 and 6, the resilient member 43 is optionally a spring, and the press cavity 16 is provided with a guide member 17 extended in the same direction as the press cavity 16. The guide member 17 is provided with a guide cavity 171 extended in the same direction as the press cavity 16, and one end of the spring is sleeved on an outer circumference of the guide member 17 and abutted against the guide member 17, and the press member 42 is inserted into the guide cavity 171. The other end of the spring abuts against the press member 42. The light-shielding member 41 is located at a side of the press member 42 and is spaced apart from the press member 42 to form an avoidance gap, so that when the press member 42 is pressed downward, the second light-shielding cavity 411 on the light-shielding member 41 can well pass through the light-transmitting opening 141 and cover the photosensitive component 30 to achieve an effect of complete shading. Moreover, in case that the second light-shielding cavity 411 on the light-shielding member 41 is covered on the photosensitive component 30, a mechanical contact is also formed between the press member 42 and the guide member 17 when the press member 42 is pressed, thereby the user can experience a certain mechanical sense of touch, and the feeling of pressing the key in place can be well felt, and thus the effect of using is good.

In another embodiment of the present application, as shown in FIGS. 1, 2 and 3, the shell 10 includes a light-shielding shell 11 and a light-transmitting shell 12 mounted on the light-shielding shell 11. The first light-shielding cavity 14 is arranged on the light-shielding shell 11, and the light-transmitting shell 12 is transparent to form a light-transmitting area 13. Optionally, the light-shielding shell 11 is an opaque shell 12, the light-transmitting shell 12 is a transparent shell, and the first light-shielding cavity 14 is arranged on the light-shielding shell 11, such that the photosensitive component 30 can only receive external light through the light-transmitting opening 141 when the photosensitive component 30 is located in the first light-transmitting cavity 14. Then, the external light is directed to the photosensitive component 30 naturally through the light-transmitting opening 141, in the normal state (i.e., when the key is not pressed), as the light-transmitting shell 12 capable of transmitting the external light in natural is arranged on the light-transmitting shell 11, thereby the electrical channel is enabled to form the off state without requiring additional light sources, which thus can effectively simplify the structure of the key and save the key production cost.

Figure 4:
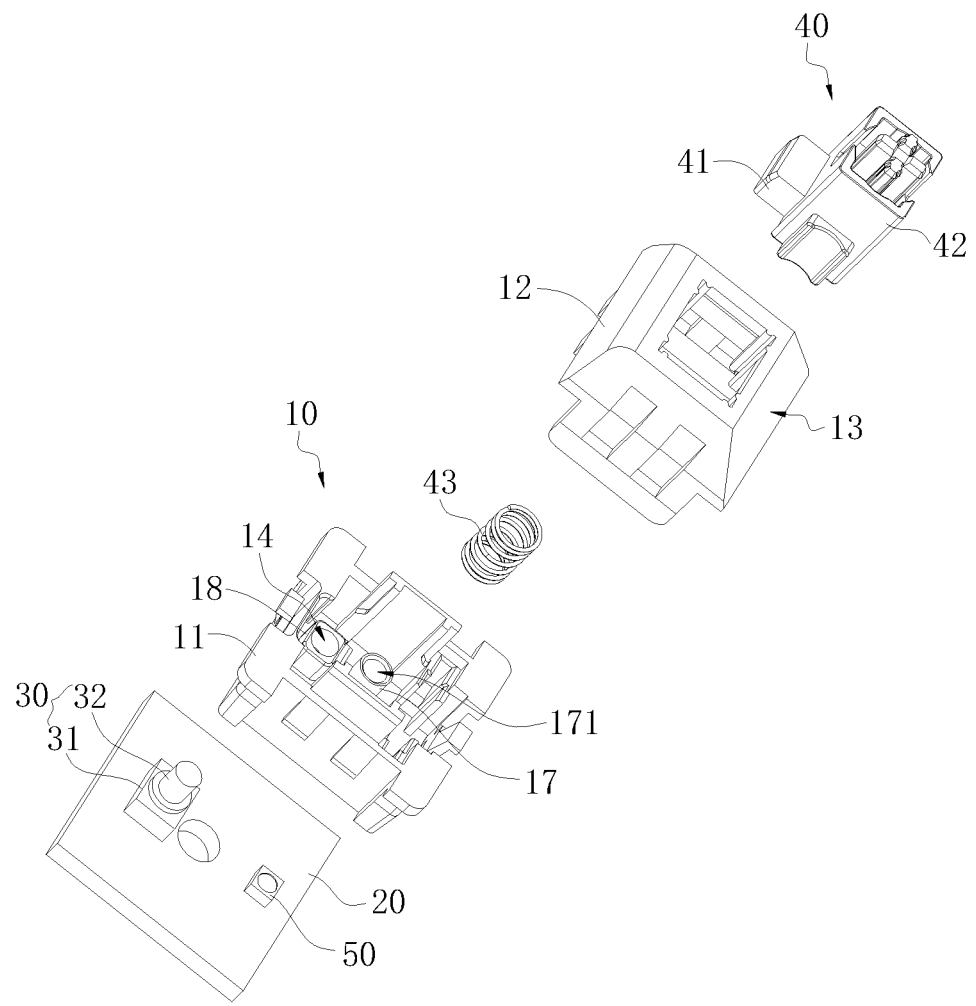
FIG. 4 is a schematic diagram of an exploded structure of the photoelectric switch key in FIG. 1.

In another embodiment of the present application, as shown in FIGS. 2, 3 and 4, the photoelectric switch key also includes an LED light 5 that is mounted on and electrically connected to the circuit board 20. The LED light 50 is configured to emit light toward the light-transmitting shell 12. Optionally, the LED light 50 is arranged on the circuit board 20, and the LED light 50, when in an on state, can emit light toward the light-transmitting shell 12, to enable the light-transmitting shell 12 to collect more enhanced light irradiation to the photosensitive component 30 to maintain the sensitivity of the photosensitive component 30. Moreover, the LED light 50 may be arranged to be various types of colorful light as desired, which enables the light irradiates on the light-transmitting shell 12 to form a good decorative effect and give users a good visual experience.

In another embodiment of the present application, as shown in FIGS. 2, 3 and 5, the light-shielding shell 11 is provided with a light-guiding cavity 15, and the light-guiding cavity 15 is provided with a light-guiding opening

151 at one end toward the light-transmitting shell 12. The LED light 50 is located within the light-guiding cavity 15 and emits light through the light-guiding opening 151 toward the light-transmitting shell 12. Optionally, the light-guiding cavity 15 is arranged on the light-shielding shell 11, the LED light 50 is covered by the light-guiding cavity 15, and then the light emitted from the LED light 50 is directed toward the light-transmitting shell 12 through the light-guiding opening 151 to achieve effective control of the light emitted from the LED light 50, avoid irregular scattering of the light emitted from the LED light 50, and enhance the irradiation effect on the light-transmitting shell 12.

In another embodiment of the present application, as shown in FIGS. 2, 3 and 4, the photosensitive component 30 includes a photosensitive element 31 that is mounted on and electrically connected to the circuit board 20, and the photosensitive element 31 is located within the first light-shielding cavity 14. Optionally, the photosensitive element 31 is configured to receive light from the light-transmitting opening 141, and the received light signal is converted by the photosensitive element 31 into an electrical signal, and through the electrical signal transmitted by the photosensitive element 31, the photosensitive element 31 is connected to the circuit module preset on the circuit board 20 to form the electrical channel. When a light signal is received by the photosensitive element 31, the electrical channel is in the off state, and no corresponding key function is input at this time, and when no light signal is received by the photosensitive element 31, the electrical channel is in the on state, and the corresponding key function is input at this time. In this embodiment of the present application, the circuit module arranged on the circuit board 20 is opposite to the conventional circuit control of the photoelectric coupling, and the function of key pressing of the circuit board 20 in this embodiment of the present application is realized based on the reverse principle.

In another embodiment of the present application, as shown in FIGS. 2 and 3, the photosensitive component 30 also includes a light-guiding member 32 that is arranged on the photosensitive element 31 and configured to guide the light to irradiate onto the photosensitive element 31 through the light-transmitting opening 141. Optionally, the light-guiding member 32 is provided in the first light-shielding cavity 14 and located between the light-transmitting opening 141 and the photosensitive element 31 to guide the light to irradiate onto the photosensitive element 31 through the light-transmitting opening 141, which enables the photosensitive element 31 to better receive the light from the light-transmitting opening 141 and ensures the sensitivity of the photosensitive element 31. In this embodiment, an annular sleeve 18 is arranged on the light-shielding shell 11, thereby the light-guiding member 32 is partially accommodated in the annular sleeve 18, and an opening of the annular sleeve 18 toward an end of the light-shielding member 41 forms the light-transmitting opening 141. In this case, the second light-shielding cavity 411 is enabled to directly cover the outer circumference of the annular sleeve 18 when the light-shielding member 41 is pressed and moved, to completely block light entering through the light-transmitting opening 141, thus the use effect is good.

In accordance with an embodiment of the present application, a keyboard is also provided, which includes the aforementioned photoelectric switch keys.

The keyboard provided by the embodiment of the present application, due to the use of the above-mentioned photoelectric switch keys, can provide the user an easy and responsive key-pressing operation, giving the user a good experience, and can achieve a simple structure, low production cost.

The above descriptions are merely some optional embodiments of the present application, and are not intended to limit the present application. For persons skilled in the art, this application may have various modifications and variations. Any modification, equivalent replacement, improvement, etc. made within the spirit and principles of this application shall all be included within the scope of the claims of the present application.

What is claimed is:

1. A photoelectric switch key, comprising:
    a shell;
    a circuit board;
    a photosensitive component, electrically connected to the circuit board; and
    a press component, provided with a light-shielding member, the press component being movably mounted on the shell to enable the light-shielding member to move relative to a light-receiving surface of the photosensitive component, and
    wherein the photosensitive component is capable of receiving external light when the light-shielding member is away from the light-receiving surface of the photosensitive component, and
    wherein the light-shielding member is adjacent to and shielding the light-receiving surface of the photosensitive component when the press component is pressed, and
    wherein the light-shielding member is provided with a second light-shielding cavity in communication with external environment at one end of the light-shielding member towards the photosensitive component, the second light-shielding cavity is configured to cover the photosensitive component and to shield the light-receiving surface of the photosensitive component.

2. The photoelectric switch key according to claim 1, wherein the shell is arranged to cover the photosensitive component, the shell is provided with a light-transmitting area that allows light to irradiate onto the photosensitive component, the shell is provided with a first light-shielding cavity, the first light-shielding cavity is provided with a light-transmitting opening at one end of the first light-shielding cavity towards the light-transmitting area, the photosensitive component is located within the first light-shielding cavity, the second light-shielding cavity is configured block light from irradiating onto the photosensitive component through the light-transmitting opening.

3. The photoelectric switch key according to claim 2, wherein the press component comprises a press member and a resilient member, the shell is provided with a press cavity, the press member is mounted in the press cavity, the resilient member abuts against the press member and a cavity wall of the press cavity, and the light-shielding member is provided on the press member.

4. The photoelectric switch key according to claim 2, wherein the shell comprises a light-shielding shell and a light-transmitting shell mounted on the light-shielding shell, the first light-shielding cavity is arranged on the light-shielding shell, the light-transmitting shell is transparent to form the light-transmitting area.

5. The photoelectric switch key according to claim 4, wherein the photoelectric switch key further comprises an LED light, the LED light is mounted on and in electrical connection with the circuit board, and the LED light is configured to emit light towards the light-transmitting shell.

6. The photoelectric switch key according to claim 5, wherein the light-shielding shell is provided with a light-guiding cavity, the light-guiding cavity is provided with a light-guiding opening at one end of the light-guiding cavity towards the light-transmitting shell, the LED light is located within the light-guiding cavity and configured to emit light towards the light-transmitting shell through the light-guiding opening.

7. The photoelectric switch key according to claim 2, wherein the photosensitive component comprises a photosensitive element, the photosensitive element is mounted on and in electrical connection with the circuit board, the photosensitive element is located within the first light-shielding cavity.

8. The photoelectric switch key according to claim 7, wherein the photosensitive component further comprises a light-guiding member, the light-guiding member is arranged on the photosensitive element and configured to guide light to irradiate onto the photosensitive element through the light transmitting opening.

9. A keyboard, comprising:
a photoelectric switch key, comprising:
  a shell;
  a circuit board;
  a photosensitive component, electrically connected to the circuit board; and
  a press component, provided with a light-shielding member, the press component being movably mounted on the shell to enable the light-shielding member to move relative to a light-receiving surface of the photosensitive component, and
  wherein the photosensitive component is capable of receiving external light when the light-shielding member is away from the light-receiving surface of the photosensitive component, and
  wherein the light-shielding member is adjacent to and shielding the light-receiving surface of the photosensitive component when the press component is pressed, and
  wherein the light-shielding member is provided with a second light-shielding cavity in communication with external environment at one end of the light-shielding member towards the photosensitive component, the second light-shielding cavity is configured to cover the photosensitive component and to shield the light-receiving surface of the photosensitive component.

10. The keyboard according to claim 9, wherein the shell is arranged to cover the photosensitive component, the shell is provided with a light-transmitting area that allows light to irradiate onto the photosensitive component, the shell is provided with a first light-shielding cavity, the first light-shielding cavity is provided with a light-transmitting opening at one end of the first light-shielding cavity towards the light-transmitting area, the photosensitive component is located within the first light-shielding cavity, the second light-shielding cavity is configured block light from irradiating onto the photosensitive component through the light-transmitting opening.

11. The keyboard according to claim 10, wherein the press component comprises a press member and a resilient member, the shell is provided with a press cavity, the press member is mounted in the press cavity, the resilient member abuts against the press member and a cavity wall of the press cavity, and the light-shielding member is provided on the press member.

12. The keyboard according to claim 10, wherein the shell comprises a light-shielding shell and a light-transmitting shell mounted on the light-shielding shell, the first light-shielding cavity is arranged on the light-shielding shell, the light-transmitting shell is transparent to form the light-transmitting area.

13. The keyboard according to claim 12, wherein the photoelectric switch key further comprises an LED light, the LED light is mounted on and in electrical connection with the circuit board, and the LED light is configured to emit light towards the light-transmitting shell.

14. The keyboard according to claim 13, wherein the light-shielding shell is provided with a light-guiding cavity, the light-guiding cavity is provided with a light-guiding opening at one end of the light-guiding cavity towards the light-transmitting shell, the LED light is located within the light-guiding cavity and configured to emit light towards the light-transmitting shell through the light-guiding opening.

15. The keyboard according to claim 10, wherein the photosensitive component comprises a photosensitive element, the photosensitive element is mounted on and in electrical connection with the circuit board, the photosensitive element is located within the first light-shielding cavity.

16. The keyboard according to claim 15, wherein the photosensitive component further comprises a light-guiding member, the light-guiding member is arranged on the photosensitive element and configured to guide light to irradiate onto the photosensitive element through the light transmitting opening.

* * * * *